United States Patent [19]
Sato et al.

[11] Patent Number: 5,288,551
[45] Date of Patent: Feb. 22, 1994

[54] FLEXIBLE PIEZOELECTRIC DEVICE

[75] Inventors: Takashi Sato; Kazuyuki Suzuki; Kenichi Nakamura, all of Iwaki, Japan

[73] Assignee: Kureha Kagaku Kogyo Kabushiki Kaisha, Tokyo, Japan

[21] Appl. No.: 925,279

[22] Filed: Aug. 6, 1992

[30] Foreign Application Priority Data

Aug. 9, 1991 [JP] Japan .............................. 3-070619[U]
Dec. 26, 1991 [JP] Japan ................... 3-356667
Dec. 26, 1991 [JP] Japan ................... 3-356668

[51] Int. Cl.$^5$ .......................................... B32B 15/08
[52] U.S. Cl. ................... 428/334; 428/336; 428/457
[58] Field of Search ............... 430/271; 428/457, 334, 428/336; 367/155

[56] References Cited

U.S. PATENT DOCUMENTS 4,296,417 10/1981 Markham et al. ................ 430/271
4,833,659  5/1989 Geil et al. ........................ 367/155

FOREIGN PATENT DOCUMENTS 3223615 12/1983 Fed. Rep. of Germany .

OTHER PUBLICATIONS

Patent Abstracts of Japan, JP63149503, vol. 012411, Publication Date Jun. 22, 1988.

*Primary Examiner*—Thomas J. Herbert, Jr.
*Attorney, Agent, or Firm*—Wenderoth, Lind & Ponack

[57] ABSTRACT

A laminated piezoelectric device is formed by sandwiching a relatively rigid central electrode layer with a pair of piezoelectric polymer films and then with a pair of outer electrode layers which are less rigid than the central electrode layer. The laminated piezoelectric device, as a whole, has a good flexibility and shows good piezoelectric characteristics represented by a hydrostatic piezoelectric constant $d_h$ and a symmetrical vibration characteristic. The outer electrode layers may preferably be constituted as a sprayed coating electrode which shows good solderability and peel strength.

12 Claims, 4 Drawing Sheets

FLEXIBLE PIEZOELECTRIC DEVICE

FIELD OF THE INVENTION AND RELATED ART

The present invention relates to a polymer-type laminated piezoelectric device or element which is flexible as a whole, and a polymer-type piezoelectric device having a sprayed coating electrode and suitable for constituting a laminated piezoelectric device.

Compared with piezoelectric ceramics, piezoelectric polymers including polarized vinylidene fluoride resin (hereinafter representatively called "PVDF") have, for example, the following characteristics, (1) a large flexibility and being easily formed into films and enlarged in area or length, thus being able to be formed in an arbitrary shape or form; (2) a similar or even smaller hydrostatic piezoelectric constant $d_h$ but a remarkably larger hydrostatic piezoelectric constant $g_h$ determined by $d_h/\epsilon$ because of a small dielectric constant $\epsilon$, thus being excellent in sensitivity; and (3) a specific acoustic impedance (sonic propagation velocity $\times$ density) which is close to that of water or a biological material, because of a low density and a low elasticity, thus being capable of providing an element or device which causes little reflection between the water or biological material and the element and thus can provide an effective energy propagation. By taking advantage of these characteristics, it has been proposed or commercialized to widely use piezoelectric polymers generally as electro-mechanical (acoustic) transducers or pyroelectric transducers in speakers, microphones, ultrasonic probes, hydrophones, vibrometers, strain gauges, blood pressure meters, bimorph fans, flame detectors, and infrared intrusion detectors.

When a piezoelectric polymer in a film or sheet form (hereinafter inclusively referred to as a "piezoelectric polymer film") is formed into a device or element, an electrode is generally provided on both surfaces thereof. In this instance, in view of the fact that a piezoelectric polymer has a durable temperature on the order of 100° C. inclusive of its piezoelectricity provided, e.g., by orientation-polarization, such an electrode has been generally formed as a vapor-deposited film of copper, aluminum, etc., or as a foil of such a metal applied with an adhesive. It has been also known to laminate a plurality of piezoelectric elements or devices thus formed to provide a laminated piezoelectric device. However, the resultant piezoelectric device thus obtained by applying a metal foil electrode has a significantly reduced flexibility, thus inhibiting sufficient utilization of the flexibility and handling ease attributable to a piezoelectric polymer per se.

SUMMARY OF THE INVENTION

A principal object of the present invention is to provide a flexible laminated piezoelectric device having improved properties without substantially impairing the excellent flexibility of a piezoelectric polymer by using a combination of electrodes having different rigidities. Particularly, an acoustic wave-receiving device furnished with a piezoelectric polymer film as a sensing element, such as an echo sounder receiver and a passive sonar, is liable to suffer from deformation noise because of its flexibility when subjected to a flexural stress. Another object of the present invention is to provide a structure of a flexible laminated piezoelectric device capable of effectively suppressing the occurrence of such deformation noise.

A further object of the present invention is to provide a flexible piezoelectric device having a sprayed coating electrode suitable for constituting such a flexible laminated piezoelectric device as described above.

As a result of our study, it has been found that, when a central electrode layer is sandwiched by a pair of piezoelectric polymer films each provided with an outer electrode layer thereon to form a laminated piezoelectric device, it is possible to ensure a symmetrical deformation of the laminated piezoelectric device with respect to the central electrode layer as the center of flexural deformation if the central electrode layer is provided with an enhanced rigidity relative to those of the outer electrode layers. We have also found that the symmetry of deformation in flexural deformation of the device is improved as a result and the flexibility of the entire device is well retained; that the device is further provided with a substantial increase in hydrostatic piezoelectric constant $d_h$ which is a representative characteristic value for use in an acoustic wave-transmitting or -receiving device, such as a speaker, microphone, ultrasonic probe, hydrophone or blood pressure meter; and that the device can be further provided with a significantly improved deformation noise-prevention effect for use in an acoustic wave-receiving device if the directions of polarization of the pair of piezoelectric polymer films are appropriately selected.

According to the present invention based on the above knowledge, there is provided a flexible laminated piezoelectric device, comprising: a relatively rigid central electrode layer, a pair of piezoelectric polymer films (in a sense of including "sheet" as described above) sandwiching the central electrode layer, and a pair of outer electrode layers sandwiching the piezoelectric polymer films, the outer electrode layers being less rigid than the central electrode layer.

It was unexpected also to us that the use of a central electrode layer having an enhanced rigidity relative to those of a pair of outer electrode layers provides an improved symmetry of deformation and also a substantial increase in hydrostatic piezoelectric constant $d_h$. The reason for the latter improvement may be considered as follows. There is a relationship of $d_h = d_{31} + d_{32} + d_{33}$ between $d_h$ and piezoelectric constants in orthogonal directions including $d_{31}$ (planar direction X), $d_{32}$ (planar direction Y) and $d_{33}$ (thickness direction Z). Herein, a piezoelectric polymer film generally has $d_{31} > 0$, $d_{32} > 0$, $d_{33} < 0$, and $|d_{33}| > d_{31} + d_{32}$. Accordingly, $d_h$ is principally governed by $d_{33}$, and the enhanced rigidity of the central electrode layer in the laminated device of the present invention suppresses the planar deformation of the piezoelectric polymer films ($d_{31} \to 0$, $d_{32} \to 0$) without hindering the thickness-wise deformation of the piezoelectric polymer films disposed on both sides of the central electrode layer, so that $d_h$ approaches $d_{33}$ and the absolute value thereof increases. Further, if the pair of piezoelectric polymer films are disposed to have mutually opposite polarization directions, electrical outputs generated in the pair of piezoelectric polymer films during deformation of the films are effectively canceled by each other because of the symmetrical deformation, so that the hydrostatic distortion output can be selectively taken out, if capacitance components of the respective piezoelectric elements are electrically connected in parallel with each other.

We have also found that a sprayed coating electrode is effective in constituting a flexible outer electrode layer as in the above-mentioned flexible laminated piezoelectric device. Thus, according to a second aspect of the present invention, there is provided a flexible piezoelectric device comprising: a piezoelectric polymer film or sheet, and a sprayed coating electrode disposed on at least one surface of the piezoelectric polymer film.

Thermal spraying is a method of spraying a molten metal onto a substrate and solidifying the metal on the substrate to form a metal coating thereon, and has seldom been used for surface-treatment of a polymer film. Contrary to our expectation, however, it has been found that an electrode can be formed by thermal spraying not considered heretofore onto a piezoelectric polymer film which has a low heat resistance because of its material and also of a polarization treatment for developing excellent piezoelectric performance, thereby providing the resultant polymer-type piezoelectric device with a rather enhanced piezoelectric performance, i.e., with an improved sensitivity.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
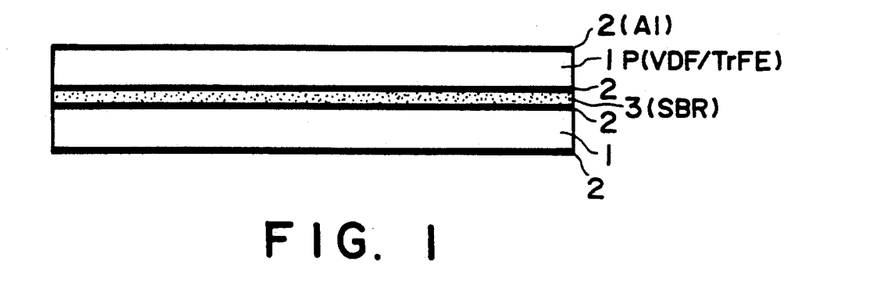
FIG. 1 is a schematic sectional view of a conventional laminated piezoelectric device.

A conventionally adopted laminated piezoelectric device generally has a sectional structure as shown in FIG. 1 including a pair of piezoelectric polymer films 1 each having surface electrode layers 2 formed, e.g., by vapor deposition of a metal, on both surfaces, and adhesive layer 3 for bonding the pair of films 1. Each electrode 2 is provided with an electrical wire as by an appropriate fixing means or by soldering.

Figure 2:
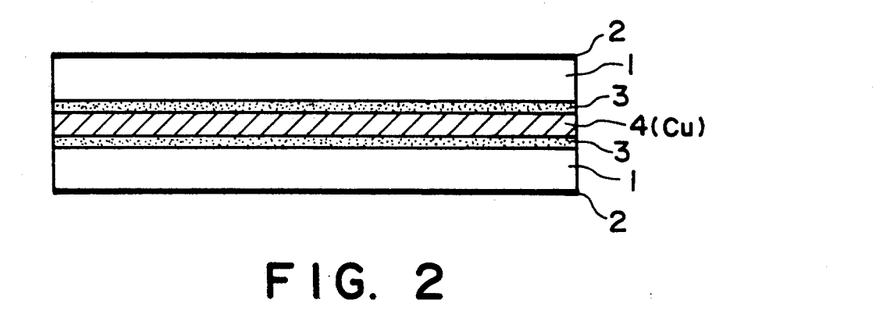
FIGS. 2 and 3 are respectively a schematic sectional view of an embodiment of the laminated piezoelectric device according to the present invention.

In contrast thereto, FIG. 2 is a sectional view of an embodiment of the laminated piezoelectric device according to the present invention. The laminated piezoelectric device comprises a pair of piezoelectric polymer films 1 each having a vapor-deposited outer electrode 2 layer on an outer surface thereof. The films 1 are applied to a rigid central electrode layer 4 at their inner surfaces opposite to the outer surfaces having the outer electrode layers 2, by a medium of adhesive layers 3. The piezoelectric polymer films 1 can have an additional electrode layer, as desired, on their inner surfaces contacting the adhesive layers 3.

The piezoelectric polymer constituting the piezoelectric polymer films 1 may suitably comprise a copolymer of vinylidene cyanide and vinyl acetate having a relatively high heat resistance, and also preferably vinylidene fluoride resin-type piezoelectric polymers showing excellent piezoelectric properties, among which it is preferred to use vinylidene fluoride (VDF) copolymers which can be formed into $\beta$ crystal required for development of piezoelectricity under ordinary crystallizing conditions compared with VDF homopolymer which requires uniaxial stretching for formation of $\beta$ crystal. Preferred examples of the VDF copolymer may include copolymers of a major amount of VDF and a minor amount of vinyl fluoride (VF), trifluoroethylene (TrFE) or tetrafluoroethylene (TFE). It is most preferred to use a copolymer of VDF in a major amount, particularly 70-80 mol. %, and TrFE in a minor amount, particularly 30-20 mol. %.

Such a piezoelectric polymer material may be formed, e.g., by melt-extrusion, into a film, which is then subjected to uniaxial stretching or heat-treatment below the softening temperature, as desired, and then a polarization treatment by application of an electric field at a temperature below the softening temperature, to form a piezoelectric polymer film. The piezoelectric polymer film 1 may preferably have a thickness of about 20-2000 μm, particularly 100-1000 μm. If the film thickness is below 20 μm, a sufficient acoustic wave-transmitting or -receiving sensitivity cannot be attained in some cases. On the other hand, above 2000 μm, the flexibility of the film is impaired, and the rigidity of the film can be dominant in flexural deformation. Further, a high voltage is required for the polarization, thus being liable to cause a surface discharge, so that the polarization treatment becomes difficult.

It is also preferred that the surface contacting the electrode 2 and/or the surface contacting the adhesive 3 of the piezoelectric polymer film 1 has been roughened in advance.

The outer electrode 2 may preferably be formed in a thickness of, e.g., 0.01-0.2 μm, particularly 0.02-0.1 μm, by vapor deposition of a well-conductive metal, such as copper, aluminum, silver, zinc, tin, nickel or gold. It is also possible to form the outer electrode 2 in a thickness of about 10-100 μm by plating, particularly by electroless plating.

The central electrode layer 4 may preferably have a rigidity which is at least 4 times that of each outer electrode layer 2 (or sprayed coating electrode 5 as described below). Such a central electrode layer may preferably comprise a foil of a well-conductive metal, such as copper, aluminum, tin, zinc, gold, silver or platinum in a thickness of 6-200 μm, particularly 20-120 μm.

Herein, the rigidity of a member, particularly a sheet member such as an electrode, is determined by a product of the Young's modulus and geometrical moment of inertia of the member. Herein, the geometrical moment of inertia is determined by $W \times D^3/12$, wherein W and D denote the width and thickness, respectively, of the member. Accordingly, as a comparison based on an identical Young's modulus and an identical width, the rigidity of an electrode is proportional to the cubic of the thickness of the electrode.

The adhesive layer 3 can be formed by a conductive adhesive containing conductive particles dispersed therein but may preferably be formed by an adhesive of, e.g., epoxy resin, polyester resin, butadiene resin, propylene resin or acrylic resin, in a layer having a thickness of about 5–40 $\mu$m.

Figure 3:
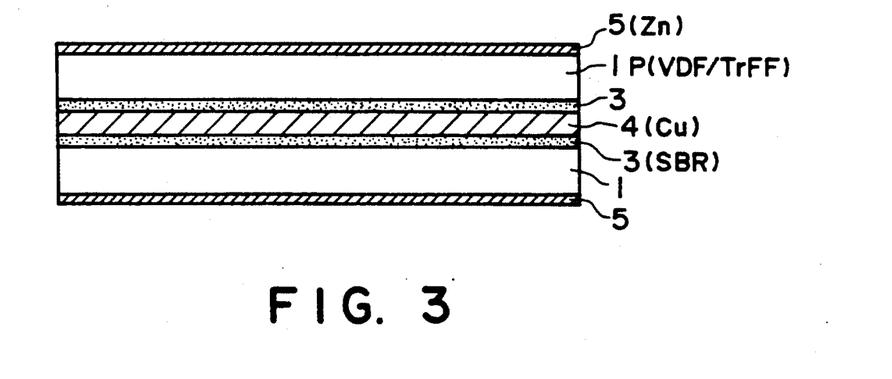

FIG. 3 illustrates a preferred embodiment of the present invention wherein a sprayed coating electrode 5 is formed as an outer electrode layer in substitution for each of the vapor-deposited electrode layers 2 in the embodiment of FIG. 2. In other respects, the embodiment in FIG. 3 is similar to that in FIG. 2 with the proviso that each piezoelectric polymer film 1 may preferably have a thickness of at least 200 $\mu$m, particularly at least 300 $\mu$m in view of heat resistance during the thermal spraying.

The use of a sprayed electrode layer 5 in place of a vapor-deposited electrode layer 2 is advantageous in that fewer defects, such as cracking and peeling of electrodes, occur at the time of soldering lead wires to the electrodes or at the soldered parts during handling of the resultant device after the soldering, and that it has a somewhat higher rigidity than the vapor-deposited electrode layer to provide an increased $d_h$ constant within an extent not impairing the flexibility of the resultant laminated piezoelectric device as a whole.

The sprayed coating electrode 5 may be constituted by, e.g., copper, aluminum, zinc, etc. and particularly suitably comprise zinc or an alloy of zinc with copper, etc., which can be sprayed at a relatively low temperature to form an electrode film with excellent solderability. The sprayed coating electrode 5 may have a thickness selected within an extent of providing good solderability and not impairing the flexibility of the resultant piezoelectric device, which may be generally preferably set within the range of 10–100 $\mu$m, particularly 20–50 $\mu$m.

The thermal spraying method for providing the electrode 5 is required to be such that the piezoelectric polymer film 1 is not excessively heated so as not to substantially impair the piezoelectricity of the film, and the wire arc spraying or the gas flame spraying (plasma spraying) may be used. Particularly, the wire arc spraying is preferred because of a small heat load applied to the piezoelectric polymer film 1 but should still preferably be performed while optionally placing the piezoelectric polymer film 1 on a revolutional member which is forcibly cooled so as to control the heat load applied to the film 1.

In the above, preferred embodiments of the laminated piezoelectric device according to the present invention have been explained with reference to FIGS. 2 and 3, it would be easily understood, however, that various modifications are possible within the scope of the present invention. For example, it is also possible to use an electroconductive rubber layer as a flexible outer electrode layer in place of the vapor-deposited electrode layer 2 or sprayed electrode layer 5 in the embodiments shown in FIGS. 2 and 3. Further, it is also possible to laminate a piezoelectric polymer film 1 having an electrode layer on one surface thereof in preferably plural film layers outside the outer electrode layers 2 or 5 in FIG. 2 or 3 to form a laminated piezoelectric device including a larger number of piezoelectric film layers. On the other hand, the central electrode layer is not restricted to one of a metal foil as described but may for example be a lamination of a pair of sprayed electrode layers formed on the respective piezoelectric polymer films bonded to each other with an adhesive as far as the lamination ensures a relatively large rigidity with respect to the outer electrode layers.

Incidentally, FIGS. 4–8 show various lamination structures of laminated piezoelectric devices outside the scope of the invention, wherein members denotes by reference numerals 1–5 are similar to those denoted by the same reference numerals in FIGS. 1–3.

Figure 9:
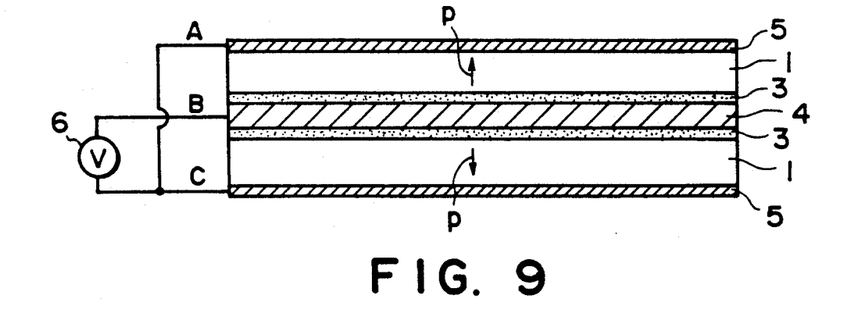
FIG. 9 is a schematic sectional view of an embodiment of the laminated piezoelectric device of the invention constituted as an acoustic wave-receiving device.

In cases where the laminated piezoelectric device according to the present invention is used, e.g., as an acoustic wave-receiving element, an arrangement as shown in FIG. 9 corresponding to FIG. 3 is preferred, wherein the polarization directions p provided to a pair of piezoelectric polymer films 1 are disposed opposite to each other, conductors A and C from a pair of outer electrode layers 5 are short-circuited so as to realize the parallel circuit connection as described before, and an output between a conductor B from a central electrode layer 4 and the conductors A and C is measured by, e.g., a voltmeter 6. As a result, even if a flexural stress is applied to the laminated piezoelectric device, electrical outputs from the pair of piezoelectric polymer films 1, i.e., an output between terminals A-B and an output between terminals B-C, are canceled by each other because of the symmetrical deformation so that they do not readily appear as a noise superposed on a hydrostatic piezoelectric output.

Incidentally, the increase in hydrostatic piezoelectric constant $d_h$ attained by the rigidity of the central electrode layer 4 according to the present invention leads to an increase not only in acoustic wave-receiving sensitivity but also in acoustic wave-transmitting sensitivity.

In the above, the utility of the laminated piezoelectric device according to the present invention has been explained principally for an acoustic wave-receiving or -transmitting device. However, the laminated piezoelectric device of the invention is also useful as an electro-mechanical transducer, such as a bimorph fan, utilizing the symmetry of vibration imparted by the rigidification of the central electrode layer. In this case, as shown in, e.g., FIG. 10 corresponding to FIG. 3, polarization directions p provided to a pair of piezoelectric polymer films 1 are disposed in the same direction, and an AC voltage is supplied to the films from an AC power supply 7, whereby the laminated piezoelectric device vibrates vertically and symmetrically like a fan with the rigid central electrode layer 4 as a symmetrical vibration center.

Figure 11:
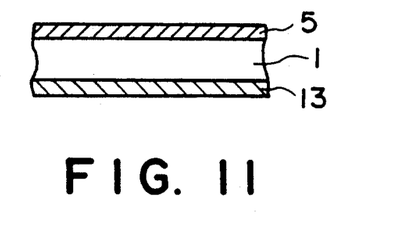
FIGS. 11 and 12 are respectively a schematic sectional view of an embodiment of the piezoelectric device having a sprayed coating electrode.

FIG. 11 illustrates a basic embodiment of the flexible piezoelectric device having a sprayed coating electrode according to the present invention. The piezoelectric device comprises a sprayed coating electrode 5 and a counter electrode 13 on one and the other surface, respectively, of a piezoelectric polymer film 1. The piezoelectric polymer film 1 and the sprayed coating electrode 5 are similar to those explained with reference to FIG. 3. The counter electrode 13 may be a sprayed coating electrode similar to the sprayed coating electrode 5 or can also be a vapor-deposited electrode of, e.g., copper or aluminum in case where solderability with a lead wire is not seriously desired.

Figure 12:
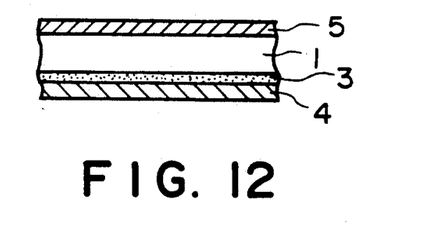

The flexible piezoelectric device according to the present invention can assume another form as shown in FIG. 12, wherein a sprayed coating electrode 5 is formed on one surface of a piezoelectric polymer film 1 and a metal foil electrode 4 is applied onto the other surface of the film 1 by the medium of an adhesive layer 3 similarly as explained with reference to FIGS. 2 and 3.

The flexible piezoelectric device shown in FIG. 12 may preferably be used because the metal foil electrode 4 is solderable as well as the sprayed coating electrode 5 disposed on the other side of the piezoelectric polymer film 1, and the provision of a metal foil electrode on one side of a piezoelectric polymer film causes only a remarkably less decrease in flexibility than in the case where such a metal foil electrode is applied onto both surfaces of a piezoelectric polymer film.

Figure 10:
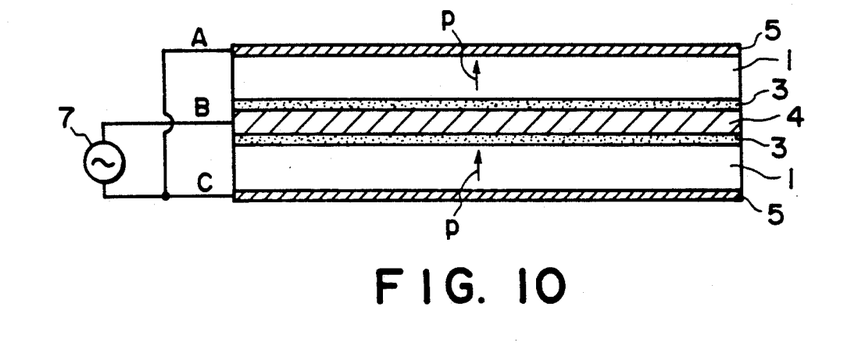
FIG. 10 is a schematic sectional view of an embodiment of the laminated piezoelectric device of the invention constituted as a bimorph device.

A bimorph piezoelectric device having a symmetrical vibration characteristic as shown in FIG. 10 may be obtained by further applying a piezoelectric polymer film having a sprayed coating electrode onto the side of the metal foil electrode 4 opposite to the side facing the piezoelectric polymer film 1 in the piezoelectric device shown in FIG. 12.

EXAMPLES AND COMPARATIVE EXAMPLES

EXAMPLE 1

Laminated piezoelectric devices having lamination structures as shown in FIGS. 1-8 (each comprising a pair of piezoelectric polymer films 1 having mutually opposite polarization directions as in FIG. 9) were respectively prepared and subjected to evaluation of performances in the following manner.

Control Example

First of all, in order to evaluate the basic properties of a piezoelectric polymer film 1, an aluminum (Al)-vapor-deposited piezoelectric polymer film was prepared.

Figure 13:
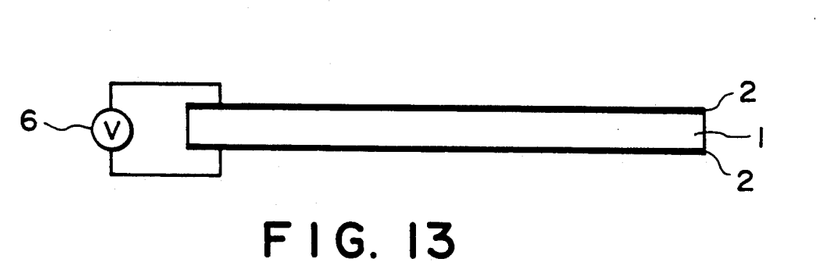
FIG. 13 is a schematic sectional illustration of measurement of the $d_h$ constant of a single layer piezoelectric device.

More specifically, a VDF/TrFE (75/25 by mol ratio) copolymer (mfd. by Kureha Kagaku Kogyo K.K.) was extruded at a die temperature of 265° C. into a sheet, which was then subjected to heat treatment at 125° C. for 13 hours and a polarization treatment under an electric field of 75 MV/m for a total of 1 hour including a hold time of 5 min. at 123° C. and the accompanying temperature-raising and -lowering time. As a result, a 500 μm-thick piezoelectric polymer film was obtained and then slit in a width of 20 mm to form 120 mm-long sample films. Then, a sample film was subjected to vapor deposition of Al to form 0.03 μm-thick Al-deposited layers on both faces of the sample film while leaving 10 mm-long both longitudinal ends as electrode-free parts. The Al-deposited film was electrically connected to a voltmeter 6 as shown in FIG. 13 and subjected to measurement of $d_h$ constant in a manner described hereinafter.

Prior to preparation of each of the devices shown in FIGS. 1-8, two sheets each of the Al-deposited film were prepared as above and their $d_h$ constants were respectively measured.

Device of FIG. 1: Comparative Example

Two sheets of the Al-deposited film 1 of Control Example as described above were applied to each other with an about 20 μm-thick layer 3 of an adhesive ("SG4693" (trade name), mfd. by Sumitomo 3M K.K.) comprising a styrene-butadiene copolymer (SBR) as a principal constituent, thereby to obtain a device of FIG. 1.

Device of FIG. 2: Example

Two Al-deposited piezoelectric films of Control Example as described above were respectively subjected to removal with ethanol of the Al-deposition electrode from one side thereof and then applied to both sides of an about 70 μm-thick copper (Cu) foil electrode 4 respectively with an about 20 μm-thick layer 3 of the same adhesive used in preparation of the device of FIG. 1, thereby to obtain a device of FIG. 2.

Device of FIG. 3: Example

Two Al-deposited piezoelectric films of Control Example as described above were respectively subjected to removal of the Al deposition electrode from both sides thereof and applied to both sides of an about 70 μm-thick Cu foil electrode 4 respectively with an about 20 μm-thick layer 3 of the same adhesive used in preparation of the device of FIG. 1. Then, two exposed surfaces of the piezoelectric polymer films 1 laminated with the Cu foil electrode 3 were roughened by sand blasting with #60-grit alumina-based abrasive and then subjected to spraying of zinc by using an electric wire-melting sprayer (Electrode-type Metal Sprayer E-type, mfd. by Kato Metallicon K.K.) under an air pressure of 5 kg/cm² and a voltage of 15 volts to form 40 μm-thick sprayed zinc electrodes 5, whereby a device of FIG. 3 was obtained.

Devices of FIGS. 4-8: Comparative Examples

Each of the devices shown in FIGS. 4-8 was prepared from two Al-deposited piezoelectric films of Control Example as described above similarly as the preparation of the devices of FIGS. 1-3 through optional steps of removing the Al-deposited electrode 2, application of an about 70 μm-thick Cu foil electrode 4 with an about 20 μm-thick layer 3 of the same adhesive as used in preparation of the device of FIG. 1 and/or formation of an about 40 μm-thick sprayed Zn electrode 5, as required.

Figure 14:
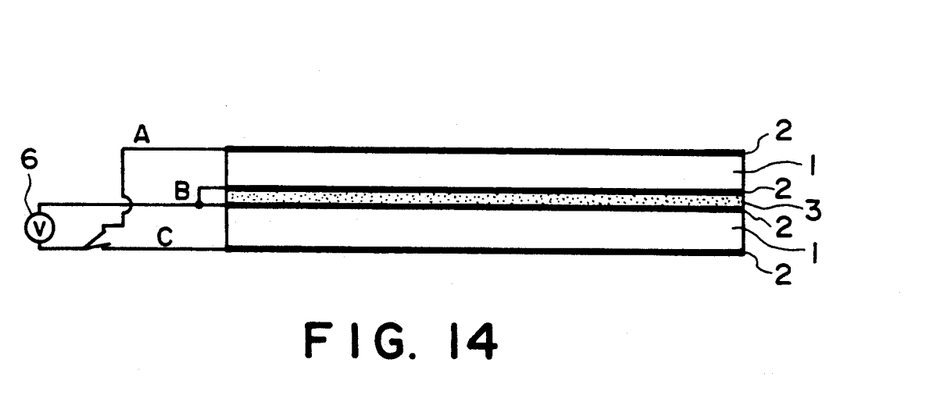
FIG. 14 is a schematic sectional illustration of measurement of the $d_h$ constant of respective layers in a laminated piezoelectric device.

The devices of FIGS. 1-8 thus obtained were respectively subjected to electrical connection, e.g., as shown in FIG. 14 with respect to the device of FIG. 1, and subjected to measurement of $d_h$ constants of an upper layer piezoelectric film (between terminals A and B) and a lower layer piezoelectric film (between terminals B and C). Incidentally, the materials copper, zinc and aluminum show Young's moduli of about $110 \times 10^9$ Newton(N)/m², $97 \times 10^9$ N/m² and $68 \times 10^9$ N/m², respectively.

The $d_h$ constants, deflecting loads and noise characteristic (canceling effect) of the devices of FIGS. 1-8 were respectively measured according to the following methods.

$d_h$ constant

A sample device was dipped in silicone oil contained in a pressure vessel, and the vessel was pressurized under a continuously increasing pressure P (Newton(N)/m²) from a nitrogen gas supply to measure a charge Q (Coulomb (C)) generated in the sample. Then, a charge increment dQ corresponding to a pressure increment dP was measured in the neighborhood of gauge pressure of 2 kg/cm², and the $d_h$ constant was calculated by the following equation:

$$|d_h| = |-(dQ/dP)/A|,$$

wherein A denotes the electrode area (m²) and the $d_h$ constant was obtained in the unit of C/N. In the present invention, the constant $d_h$ is expressed in terms of the absolute value thereof according to the above formula.

Deflecting Load

Figure 15:
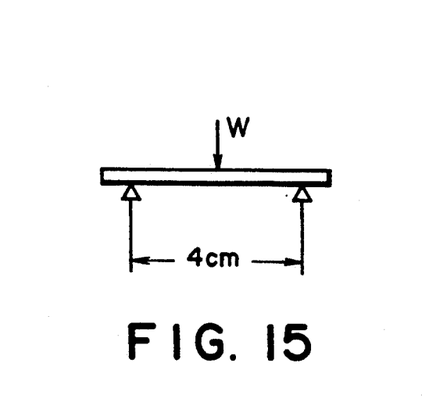
FIG. 15 is a schematic illustration of measurement of a deflecting load.

Each of the devices of FIGS. 1-8 was supported at two fulcrums 4 cm distant from each other as shown in FIG. 15, and an increasing load W was applied to the device at the mid point between the fulcrums at a rate of 50 mm/min by using a testing machine ("STROGRAPH-R2", mfd. by K. K. Toyo Seiki Seisakusho), whereby a load W required for causing a 2 mm deflection of the sample was measured and divided by the sample width (2 cm) to obtain a deflecting load (kg/cm).

Noise Characteristic

Each of the devices of FIGS. 1-8 was vibrated with the electrode-free part at one end as a fixed fulcrum so as to provide an amplitude of about 10 mm at the other end, and an output between terminals AC and B (terminals A and C were short-circuited e.g., as shown in FIG. 9 with respect to the device of FIG. 3), an output between terminals A and B (open between terminals B and C) and an output between terminals B and C (open between terminals A and B) were measured by means of a digital oscilloscope (Model DL-2240, mfd. by Yokogawa Denki K.K.). From an output waveform on the resultant oscillogram, an average of the peak voltage values was obtained. The noise characteristic was evaluated by a ratio of (an output average between terminals AC and B)/(a larger one of an output average between terminals A and B and an output average between terminals B and C). The noise characteristic was evaluated as × if the ratio was ¼ or above, Δ if the ratio was at least 1/6 and below ¼, and ◯ if the ratio was below 1/6.

Figure 5:
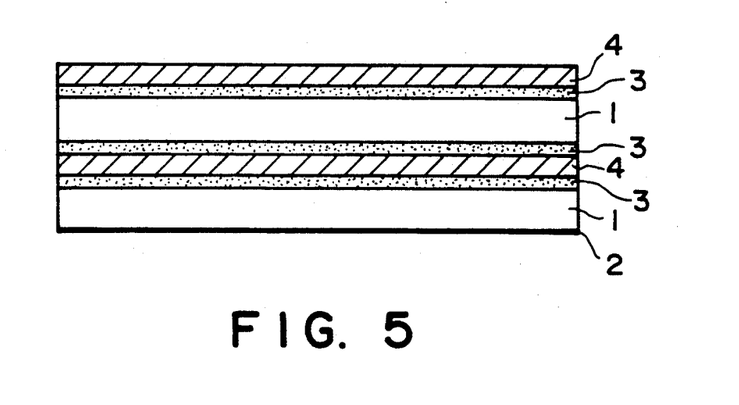
Figure 6:
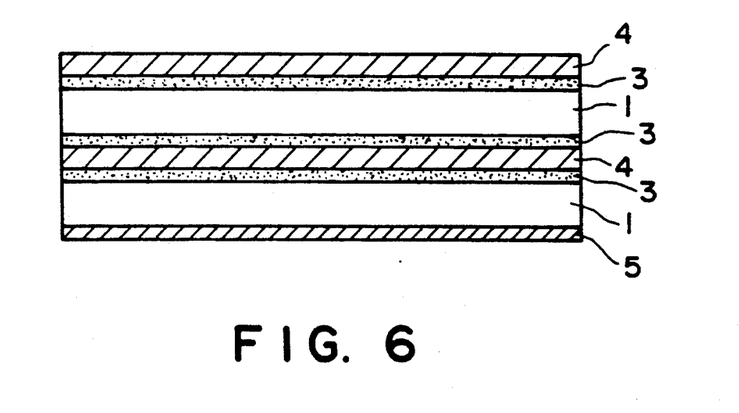
Figure 7:
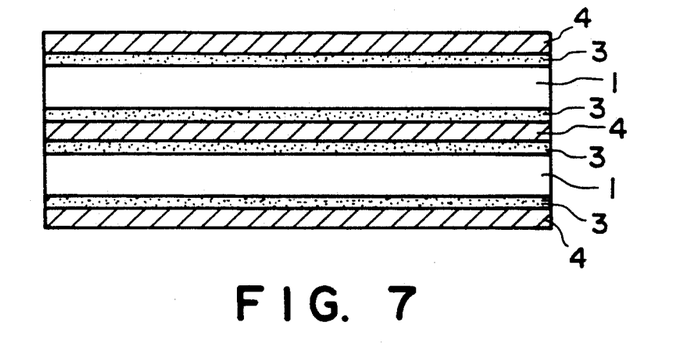

The results are summarized in the following Table 1.

ing load and good noise-canceling effect, however, the devices of FIGS. 5-7 showed a remarkable increase in deflecting load and the devices of FIGS. 5 and 6 failed to show good noise-canceling effect. Further, the device of FIG. 1 failed to show a sufficient noise-canceling effect, regardless of symmetry in respect of the materials constituting the device. This may be attributable to the fact that the device of FIG. 1 lacks a clear vibration center (axis or plane).

Example 2

A piezoelectric device of the structure shown in FIG. 12 was prepared in the following manner.

One surface of a 500 μm-thick piezoelectric polymer film 1 identical to the one obtained in Example 1 was roughened and applied to a 35 μm-thick copper foil 4 by the medium of a 20 μm-thick polyester-based adhesive layer 3.

The other surface of the thus-applied piezoelectric polymer film 1 was roughened by sand blasting with #60-grit alumina-based abrasive and then subjected to spraying of zinc by using an electric wire-melting sprayer (Electrode-type Metal Sprayer E-type, mfd. by Kato Metallicon K.K.) under an air pressure of 5 kg/cm² and a voltage of 15 volts to form a 40 μm-thick sprayed zinc electrode 5, whereby a device of FIG. 12 was obtained.

Example 3

A piezoelectric device having a structure similar to the one shown in FIG. 11 but having sprayed electrodes 5 on both surfaces instead of one surface was prepared by forming sprayed zinc electrodes 5 in the same manner as in Example 2 on both surface of a piezoelectric polymer film 1 identical to the one prepared in Example 2.

The piezoelectric device was subjected to measurement of an electrode peel strength by a 90 degree-peeling test, whereby a value of 1.08 kg/cm was obtained. Herein, the electrode peel strength was measured in

TABLE 1

Figure 4:
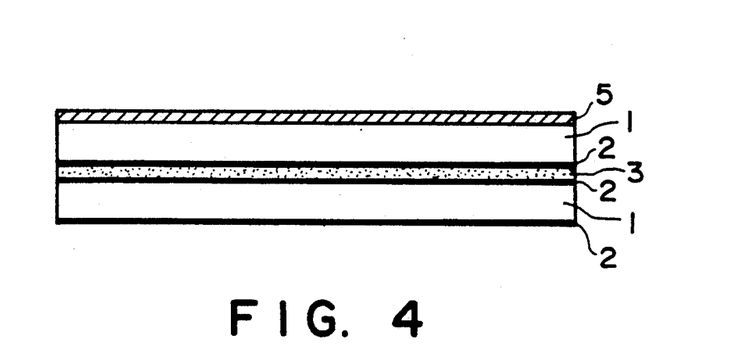
FIGS. 4-8 are schematic sectional views each showing a laminated piezoelectric device outside the scope of the present invention.
Figure 8:
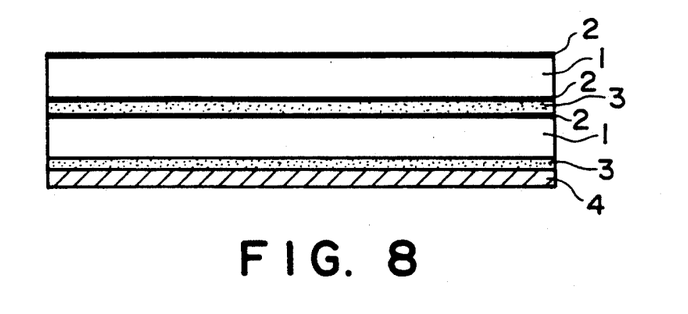

| Device | Classification | $d_h$ constant (pC/N) | | | | Deflecting load (kg/cm) | Noise |
|---|---|---|---|---|---|---|---|
| | | Control | Upper layer (increase: %) | Control | Lower layer (increase: %) | | |
| FIG. 1 | Comparative | 9.8 | 10.7 (9%) | 9.8 | 10.5 (7%) | 0.35 | Δ |
| FIG. 2 | Example | 10.0 | 12.9 (29%) | 10.0 | 12.9 (29%) | 0.48 | ◯ |
| FIG. 3 | " | 9.9 | 14.2 (43%) | 9.9 | 14.0 (41%) | 0.55 | ◯ |
| FIG. 4 | Comparative | 9.6 | 11.4 (19%) | 9.6 | 10.3 (7%) | 0.45 | × |
| FIG. 5 | " | 9.9 | 14.2 (44%) | 9.9 | 13.2 (34%) | 1.60 | × |
| FIG. 6 | " | 9.8 | 14.0 (43%) | 9.8 | 14.0 (43%) | 1.63 | × |
| FIG. 7 | " | 9.6 | 13.7 (42%) | 9.6 | 13.4 (40%) | 2.95 | ◯ |
| FIG. 8 | " | 9.8 | 10.7 (9%) | 10.0 | 12.9 (29%) | 0.88 | × |

As is clear from the above Table 1, when the control values obtained by a single layer of Al-deposited piezoelectric film are compared with the values (for the upper layer and lower layer) in the laminated piezoelectric devices, the devices of FIGS. 2, 3 and 5-7 having a rigid central electrode layer showed remarkable increases in $d_h$ constant. While the devices of FIGS. 2 and 3 classified as Examples of the present invention showed a good flexibility represented by a small deflectthe following manner. An epoxy adhesive ("Araldite AW 106" (resin): "HV 953U" (hardener)=1:1, available from Nippon Ciba-Geigy K.K.) was applied on a 35 μm-thick copper foil, and an electrode-forming surface of a piezoelectric device was applied thereto, followed by 20 min. of pressing under 100 kg/cm² at 90° C. The thus applied sample was subjected to a 90-degree peeling test at a rate of 50 mm/min. by using a testing machine ("STROGRAPH R-2", mfd. by K. K. Toyo Seiki Seisakusho) according to JIS C-6481. Incidentally, it has been empirically known that the electrode peel strength shows a good correlation with a resistance to defects, such as cracks or peeling, during connection of a lead wire to an electrode with a solder or handling of the resultant device thereafter, i.e., a good correlation with solderability with a lead wire of the electrode.

Comparative Example 2

A 0.03 μm-thick aluminum-deposition film was formed on both surfaces of a piezoelectric polymer film 1 identical to the one prepared in Example 2, thereby to obtain a piezoelectric device. The piezoelectric device showed an electrode peel strength of 0.03 kg/cm as a result of the 90-degree peeling test, thus showing an easy peelability of the electrode.

Comparative Example 3

A 35 μm-thick copper foil was applied onto both surfaces of a piezoelectric polymer film 1 identical to the one prepared in Example 2 to prepare a piezoelectric device.

Comparative Example 4

A piezoelectric device was prepared in the same manner as in Comparative Example 2 except that copper was vapor-deposited instead of aluminum.

The electrodes in the respective piezoelectric devices prepared in the above Examples and Comparative Examples were subjected to a soldering test, whereby the sprayed zinc electrodes and copper foil electrodes formed in Examples 2, 3 and Comparative Example 3 showed good solderability with a lead wire, whereas the copper deposition electrode formed in Comparative Example 4 caused peeling or cracks at parts around the soldered part at the time of soldering with a lead wire.

Then, the respective piezoelectric devices were subjected to measurement of piezoelectricity ($d_h$ constant) and flexibility (deflecting load), whereby the results shown in the following Table 2 were obtained.

TABLE 2

|  | $d_h$ constant (pC/N) | Deflecting load (g/cm) |
| --- | --- | --- |
| Example 2 | 11.7 | 165 |
| Example 3 | 11.8 | 92 |
| Comp. Example 2 | 10.5 | 47 |
| Comp. Example 3 | 11.1 | 708 |

As described above, according to the present invention, there is provided a laminated piezoelectric device exhibiting good piezoelectric characteristics represented by a hydrostatic piezoelectric constant $d_h$ and symmetrical vibrating characteristic while retaining a good flexibility as a whole, by sandwiching a relatively rigid central electrode layer with a pair of piezoelectric polymer films and then with a pair of less rigid outer electrode layers. Further, it is possible to obtain a noise-canceling characteristic if the pair of piezoelectric polymer films are imparted with mutually reverse directions of polarization. Further, if the less rigid outer electrode layers are constituted by a sprayed coating electrode, good solderability and electrode peel strength are ensured.

What is claimed is:

1. A flexible laminated piezoelectric device, comprising: a relatively rigid central electrode layer, a pair of piezoelectric polymer films or sheets sandwiching the central electrode layer, and a pair of outer electrode layers sandwiching the piezoelectric polymer films or sheets; the outer electrode layers comprising at least one of a vapor-deposited coating electrode and a thermally sprayed coating electrode and being less rigid than the central electrode layer and providing a symmetrical flexural deformation characteristic to the laminated piezoelectric device.

2. A device according to claim 1, wherein the central electrode layer comprises a metal foil electrode, and said pair of piezoelectric polymer films or sheets are applied onto both surfaces of the metal foil electrode with an adhesive.

3. A device according to claim 1, wherein the outer electrode layers comprise a vapor-deposited coating electrode having a thickness of 10 to 100 μm.

4. A device according to claim 1, wherein the outer electrode layers comprise a thermally sprayed coating electrode having a thickness of 10 to 100 μm.

5. A device according to claim 1, wherein said pair of piezoelectric polymer films or sheets are disposed to have mutually opposite directions of polarization.

6. A flexible piezoelectric device, comprising: a piezoelectric polymer film or sheet, and a thermally sprayed coating electrode disposed on at least one surface of the piezoelectric polymer film or sheet.

7. A device according to claim 6, wherein the thermally sprayed coating electrode comprises zinc or zinc-copper alloy.

8. A device according to claim 6, wherein the thermally sprayed coating electrode is disposed on one surface of the piezoelectric polymer film or sheet, and a metal foil electrode is disposed on the other surface of the piezoelectric polymer film or sheet.

9. A laminated piezoelectric device, comprising a pair of flexible piezoelectric devices each according to claim 6, which are of identical or different structures and applied to each other so that their sprayed coating electrodes form outer electrode layers.

10. A device according to claim 6, wherein the thermally sprayed coating electrode has a thickness of 10 to 100 μm.

11. A wave-transmitting or-receiving device comprising a piezoelectric device having a relatively rigid central electrode layer, a pair of piezoelectric polymer films or sheets sandwiching the central electrode layer, and a pair of outer electrode layers sandwiching the piezoelectric polymer films or sheets; the outer electrode layers comprising at least one of a vapor-deposited coating electrode and a thermally sprayed coating electrode and being less rigid than the central electrode layer and providing a symmetrical flexural deformation characteristic to the laminated piezoelectric device.

12. A bimorph fan comprising a piezoelectric device having a relatively rigid central electrode layer, a pair of piezoelectric polymer films or sheets sandwiching the central electrode layer, and a pair of outer electrode layers sandwiching the piezoelectric polymer films or sheets; the outer electrode layers comprising at least one of a vapor-deposited coating electrode and a thermally sprayed coating electrode and being less rigid than the central electrode layer and providing a symmetrical flexural deformation characteristic to the laminated piezoelectric device.

* * * * *